(12) United States Patent
Jung et al.

(10) Patent No.: US 11,486,933 B2
(45) Date of Patent: Nov. 1, 2022

(54) BATTERY SYSTEM

(71) Applicant: Samsung Electronics Co., Ltd., Suwon-si (KR)

(72) Inventors: Daebong Jung, Seongnam-si (KR); Youngjae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 325 days.

(21) Appl. No.: 16/834,044

(22) Filed: Mar. 30, 2020

(65) Prior Publication Data

US 2021/0165048 A1 Jun. 3, 2021

(30) Foreign Application Priority Data

Dec. 3, 2019 (KR) ........................ 10-2019-0159139

(51) Int. Cl.
*H01M 10/48* (2006.01)
*G01R 31/3835* (2019.01)
*G01R 31/396* (2019.01)
*G01K 13/00* (2021.01)
*H01M 10/42* (2006.01)

(52) U.S. Cl.
CPC ......... *G01R 31/3835* (2019.01); *G01K 13/00* (2013.01); *G01R 31/396* (2019.01); *H01M 10/425* (2013.01); *H01M 10/482* (2013.01); *H01M 10/486* (2013.01); *H01M 2010/4271* (2013.01); *H01M 2010/4278* (2013.01)

(58) Field of Classification Search
CPC .. G01K 13/00; G01R 31/3835; G01R 31/396; H01M 10/425; H01M 10/482; H01M 10/486; H01M 2010/4271; H01M 2010/4278; H01M 2220/20; H01M 50/209; H01M 50/262; H01M 50/284; H01M 50/543; Y02E 60/10
See application file for complete search history.

(56) References Cited

U.S. PATENT DOCUMENTS

| | | |
|---|---|---|
| 7,879,485 B2 | 2/2011 | Yoon et al. |
| 7,972,185 B2 | 7/2011 | Kim |
| 8,117,857 B2 | 2/2012 | Kelty et al. |
| 8,508,191 B2 | 8/2013 | Kim et al. |
| 8,618,775 B2 | 12/2013 | Hermann et al. |

(Continued)

FOREIGN PATENT DOCUMENTS

| | | | | |
|---|---|---|---|---|
| EP | 3352305 A1 | * | 7/2018 | ............ H01M 2/206 |
| KR | 10-2007-0043496 A | | 4/2007 | |

(Continued)

*Primary Examiner* — Victoria H Lynch
(74) *Attorney, Agent, or Firm* — NSIP Law (57) ABSTRACT

A battery system includes a first battery cell including a first electrode terminal and a second electrode terminal, a connector configured to be electrically connected to the first electrode terminal, and a first circuit board detachably provided above the connector and configured to monitor a battery characteristic of the first battery cell. The connector includes a base including a terminal hole configured to be connected to the first electrode terminal and having a first plane, a connecting portion configured to be connected to the first circuit board and having a second plane non-planar with the first plane, and a stepped portion between the base and the connecting portion.

20 Claims, 9 Drawing Sheets

(56) References Cited

U.S. PATENT DOCUMENTS

| | | |
|---|---|---|
| 8,624,560 B2 | 1/2014 | Ungar et al. |
| 8,961,203 B2 | 2/2015 | Lee |
| 8,972,213 B2 | 3/2015 | Zhang et al. |
| 9,722,229 B2 | 8/2017 | Kallur et al. |
| 2008/0286634 A1* | 11/2008 | Naito .................. H01M 50/213 429/99 |

FOREIGN PATENT DOCUMENTS

| | | |
|---|---|---|
| KR | 10-2007-0043501 A | 4/2007 |
| KR | 10-2013-0006880 A | 1/2013 |
| KR | 10-2013-0101457 A | 9/2013 |
| KR | 10-2014-0144473 A | 12/2014 |
| KR | 10-2017-0011001 A | 2/2017 |
| KR | 10-2017-0083088 A | 7/2017 |
| KR | 10-2018-0091446 A | 8/2018 |

* cited by examiner

BATTERY SYSTEM

CROSS-REFERENCE TO RELATED APPLICATIONS

This application claims the benefit under 35 USC § 119(a) of Korean Patent Application No. 10-2019-0159139 filed on Dec. 3, 2019, in the Korean Intellectual Property Office, the entire disclosure of which is incorporated herein by reference for all purposes.

BACKGROUND

Field

The following description relates to a battery system.

2. Description of Related Art

A battery management system (BMS) that monitors battery characteristics such as, for example, a voltage and a temperature of a battery cell, is being developed. A BMS that is readily attachable and detachable for repair and maintenance to a means of transportation, such as a vehicle, to which a battery cell is applied is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery system including a first battery cell comprising a first electrode terminal and a second electrode terminal, a connector configured to be electrically connected to the first electrode terminal, and a first circuit board detachably mounted above the connector and configured to monitor a battery characteristic of the first battery cell, wherein the connector comprises a base including a terminal hole configured to be connected to the first electrode terminal and having a first plane, a connecting portion configured to be connected to the first circuit board and having a second plane non-planar with the first plane, and a stepped portion between the base and the connecting portion.

The first plane and the second plane may be parallel to each other.

The connector may include an elastically deformable clamp configured to be connected to a temperature sensor.

The clamp may be formed in the base and is disposed adjacent to the terminal hole.

The clamp may include a first flat portion extending in a first direction from an edge of the base, a second flat portion extending in the first direction and being separate from the first flat portion, and a first curved portion connecting the first flat portion and the second flat portion, and defining a space that receives the temperature sensor.

The battery system may include an elastically deformable clip configured to fix the temperature sensor to the clamp.

The clip may include a first extending portion, a second extending portion extending in an extension direction that is same as an extension direction of the first extending portion, and a third extending portion connecting the first extending portion and the second extending portion and extending in an extension direction orthogonal to the extension direction of the first extending portion and the second extending portion.

The clip may include a fourth extending portion extending in an extension direction that is same as the extension direction of the first extending portion on an opposite side of the first extending portion with respect to the second extending portion, and being connected to the third extending portion.

The clip may include a fifth extending portion extending in an extension direction that is same as the extension direction of the third extending portion from an end portion of the first extending portion.

The first circuit board may include a plate, a first portion of the plate to be attached to the connecting portion, a second portion of the plate on an opposite side of the first portion and extending in a direction away from the connection portion, a power receiver provided in the second portion and configured to receive power from the first battery cell through the connector, and a voltage sensor provided in the second portion and configured to sense a voltage of the first battery cell.

The battery system may include a second battery cell comprising a third electrode terminal to which the connector is electrically connected, and a fourth electrode terminal to which the connector is not electrically connected, and a second circuit board detachably mounted above the connector and configured to monitor a battery characteristic of the second battery cell, wherein each of the first circuit board and the second circuit board comprise wireless communicators configured to wirelessly communicate with each other.

The connecting portion may be flat and configured to contact the first circuit board.

The battery system may include a fixing portion disposed between the first battery cell and the connecting portion, and configured to be fastened to the connecting portion and the first circuit board to fix the connector and the first circuit board.

The connecting portion may include a second clamp configured to elastically support the first circuit board.

The second clamp may include a third flat portion extending from the stepped portion, a fourth flat portion extending in a same extension direction as an extension direction of the third flat portion and being separate from the third flat portion, and a second curved portion connecting the third flat portion and the fourth flat portion.

The first circuit board may include a power receiver configured to receive power from the first battery cell through the connector, and a voltage sensor configured to sense a voltage of the first battery cell, wherein the connecting portion comprises a second clamp configured to be connected to the power receiver and elastically support the first circuit board, and a third clamp being separate from the second clamp and configured to be connected to the voltage sensor and elastically support the first circuit board.

In another general aspect, there is provided a battery system including a first battery cell comprising a first electrode terminal and a second electrode terminal, a connector configured to be electrically connected to the first electrode terminal, and a first circuit board detachably mounted above the connector, wherein the connector comprises a base having a first plane and comprising a hole configured to be connected to the first electrode terminal, a connecting portion non-planar with the first plane and configured to be connected to the first circuit board, a stepped portion between the base and the connecting portion, and a clamp extending away from the base and being disposed adjacent to the hole.

The clamp may include a first flat portion extending away an edge of the base, a second flat portion separate from the first flat portion, and a first curved portion connecting the first flat portion and the second flat portion to define a space to receive a temperature sensor.

The second flat portion may be elastically deformable to securely engage the temperature sensor.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s). Although terms of "first" or "second" may be used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Also, in the description of example embodiments, detailed description of structures or functions that are thereby known after an understanding of the disclosure of the present application will be omitted when it is deemed that such description will be redundant or cause ambiguous interpretation of the example embodiments.

Hereinafter, examples will be described in detail with reference to the accompanying drawings, and like reference numerals in the drawings refer to like elements throughout.

Referring to FIGS. 1 through 10, a battery system 1 may supply power to a means of transportation such as, for example, a vehicle.

The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an intelligent vehicle, a self-driving vehicle, an unmanned aerial vehicle, an electric vehicle (EV), a hybrid vehicle, a smart mobility device, an intelligent vehicle with an advanced driver assistance system (ADAS), or a drone. In an example, the smart mobility device includes mobility devices such as, for example, electric wheels, electric kickboard, electric scooter, and electric bike. In an example, vehicles include motorized and non-motorized vehicles, for example, a vehicle with a power engine (for example, a cultivator or a motorcycle), a bicycle or a handcart.

In addition to the vehicle described herein, methods and apparatuses described herein may be included in various other devices, such as, for example, a smart phone, a walking assistance device, a wearable device, a security device, a robot, a mobile terminal, and various Internet of Things (IoT) devices.

Figure 1:
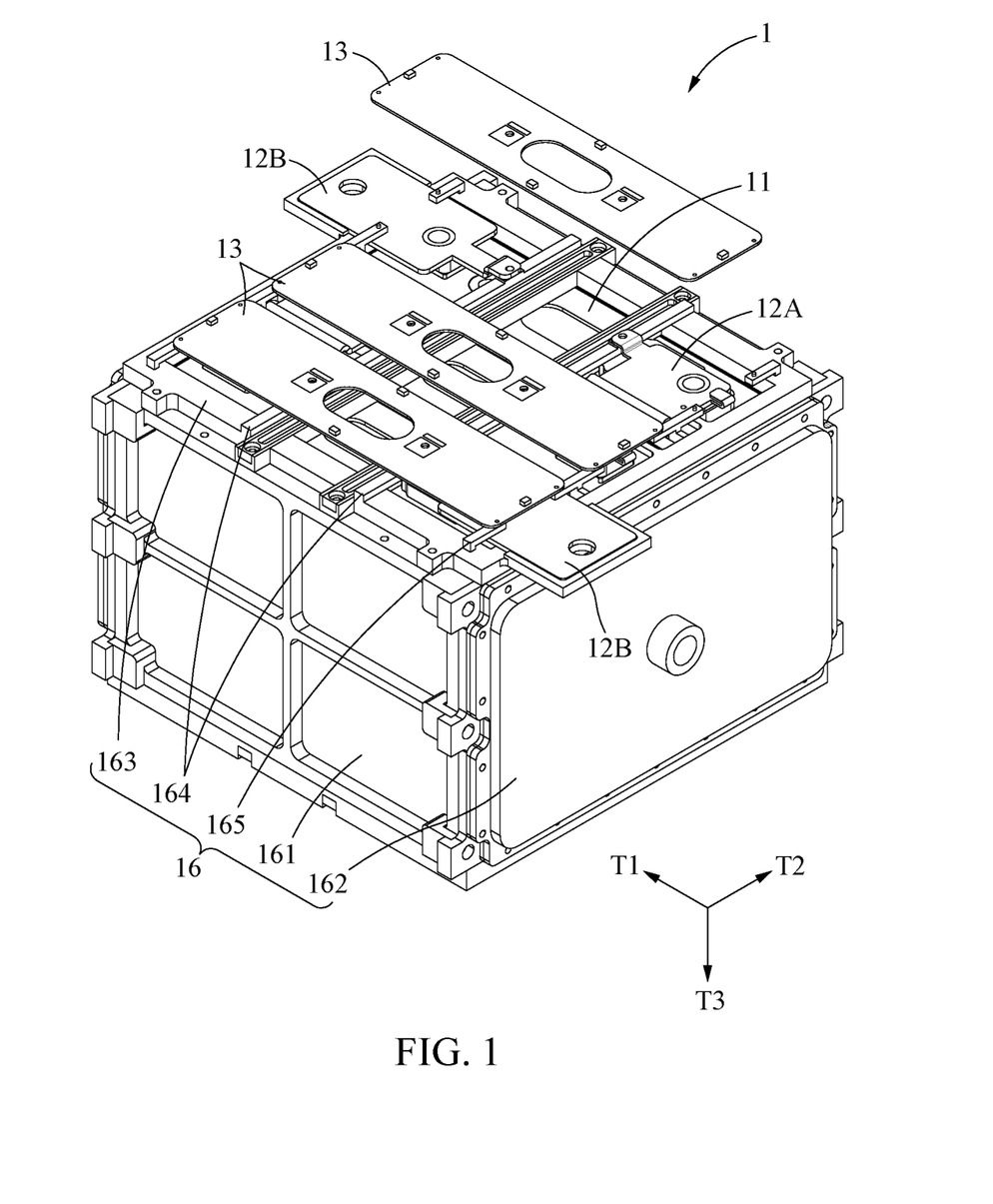
FIG. 1 is a diagram illustrating an example of a battery system.
Figure 2:
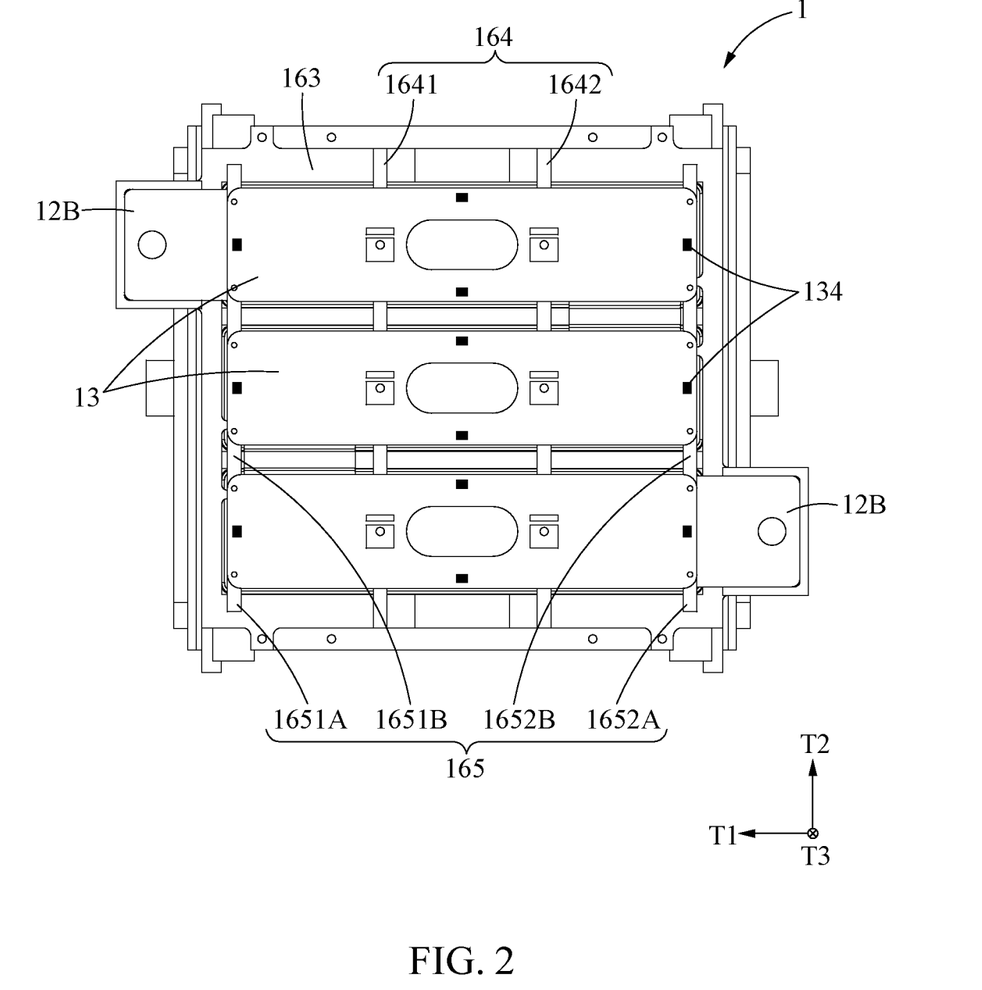
FIG. 2 is a diagram illustrating an example of a battery system.
Figure 3:
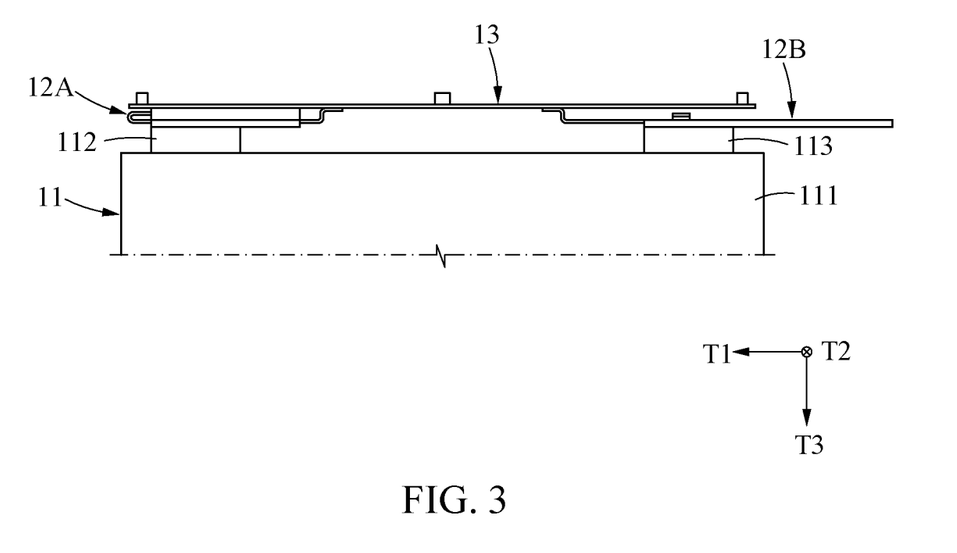
FIG. 3 is a diagram illustrating an example of a battery system.

In an example, the battery system 1 includes a plurality of battery cells (including a battery cell 11 as illustrated), a plurality of first connectors (including a first connector 12A as illustrated), a plurality of second connectors (including a second connector 12B as illustrated), a plurality of circuit boards (including a circuit board 13 as illustrated), a temperature sensor 14, a clip 15, and a support 16.

As shown in the example of FIG. 3, the battery cell 11 includes a can 111, a first electrode terminal 112, and a second electrode terminal 113.

In an example, the can 111 includes at least one positive electrode plate, at least one negative electrode plate, and at least one separator disposed between the positive electrode plate and the negative electrode plate. The can 111 may receive or accommodate the electrolyte within the can 111.

The first electrode terminal 112 and the second electrode terminal 113 may protrude from an upper side of the can 111. The first electrode terminal 112 may be electrically connected to one of at least one positive electrode plate and at least one negative electrode plate, and the second electrode terminal 113 may be electrically connected to another one of at least one positive electrode plate and at least one negative electrode plate.

The first connector 12A may electrically connect one pair of electrode terminals of the battery cell 11. The second connector 12B may be electrically connected to an electrode terminal to which the first connector 12A is not electrically connected among electrode terminals of the battery cell 11. For example, as illustrated in FIG. 2, the first connector 12A is electrically connected to the first electrode terminal 112, and the second connector 12B is electrically connected to the second electrode terminal 113.

The first connector 12A and the second connector 12B may be connected to the first electrode terminal 112 and the second electrode terminal 113, respectively. For example, the first connector 12A and the second connector 12B may be welded to the first electrode terminal 112 and the second electrode terminal 113. The welding may include welding, such as, for example, laser welding and ultrasonic welding. The, electrical resistance between the first connector 12A and the first electrode terminal 112 and electric resistance between the second connector 12B and the second electrode terminal 113 is reduced or minimized. In an example, the first connector 12A and the second connector 12B may be disposed just above the first electrode terminal 112 and the second electrode terminal 113.

Figure 6:
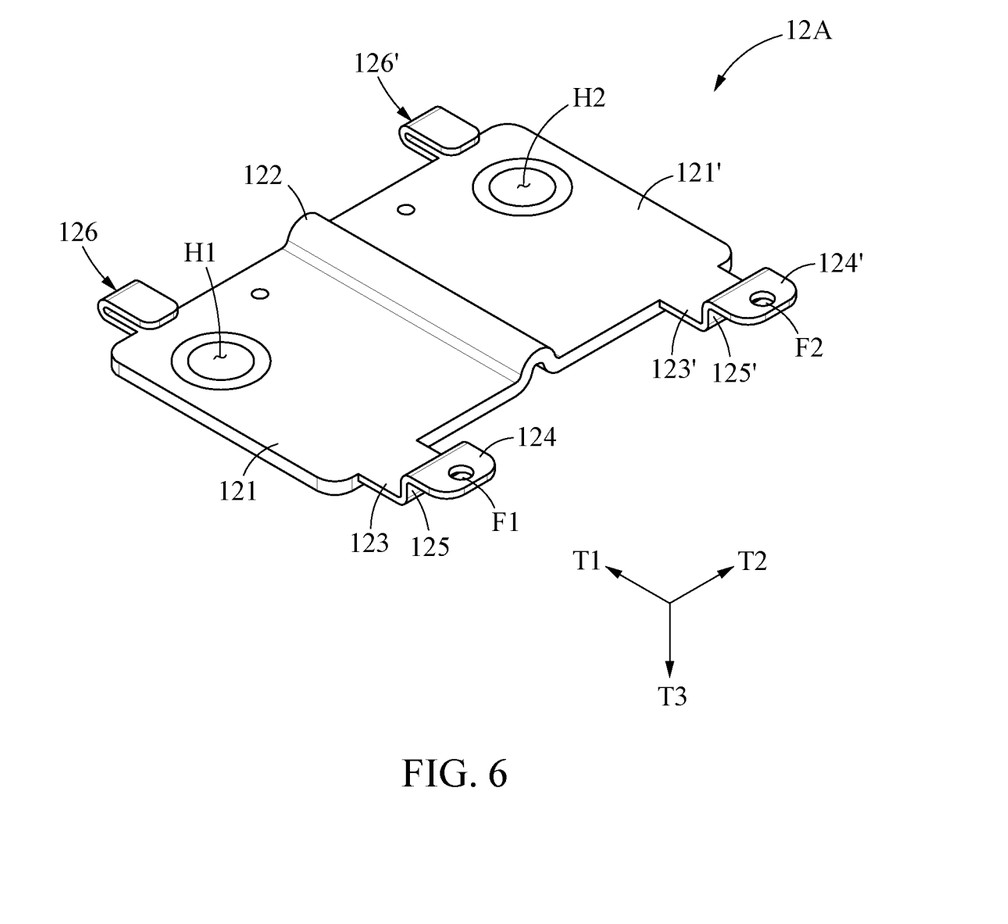
FIG. 6 is a diagram illustrating an example of a first connector.

In an example, the first connector 12A may be connected to the first electrode terminal 112 or the second electrode terminal 113 of the battery cell 11. As shown in FIG. 6, the first connector 12A includes terminal holes H1 and H2 to be electrically connected, a plurality of bases 121 and 121' having a first plane, a convex portion 122 configured to connect the bases 121 and 121' and provided in a convex shape, a plurality of protrusions 123 and 123', a plurality of connecting portions 124 and 124' having respective fastening holes F1 and F2 to be connected to the circuit board 13, a plurality of stepped portions 125 and 125', and a plurality of clamps 126 and 126'. In an example, the bases 121 and 121', the protrusions 123 and 123', the connecting portions 124 and 124', the stepped portions 125 and 125', and the clamps 126 and 126' may be respectively provided as being symmetric with respect to the convex portion 122 and as having corresponding functions. Hereinafter, for convenience of description the first connector 12A will be described in detail in relation to the base 121.

In an example, the protrusion 123 may protrude from an edge of the base 121. The protrusion 123 may have a plane that is substantially the same as a first plane of the base 121. In an example, the protrusion 123 may be thinner than the base 121 in thickness.

The connecting portion 124 may be connected to the circuit board 13. The connecting portion 124 may be provided in a flat shape and contact a surface of the circuit board 13.

In an example, the connecting portion 124 may have a second plane. In an example, the second plane of the connecting portion 124 may be non-planar with the first plane of the base 121. The stepped portion 125 may be formed between the protrusion 123 protruding from the edge of the base 121 and the connecting portion 124. Through this, the circuit board 13 may be provided or installed above the first connector 12A without being in direct contact with the base 121. Thus, it is possible to ensure a reliable operation of the circuit board 13. In addition, it is possible to readily separate the circuit board 13 when the circuit board 13 needs to be updated or repaired without having to separate the first connector 12A connected to the first electrode terminal 112 or the second electrode terminal 113.

In an example, the first plane of the base 121 and the second plane of the connecting portion 124 may be parallel to each other. In addition, the stepped portion 125 may have a plane that is vertical to the first plane and the second plane.

Figure 7:
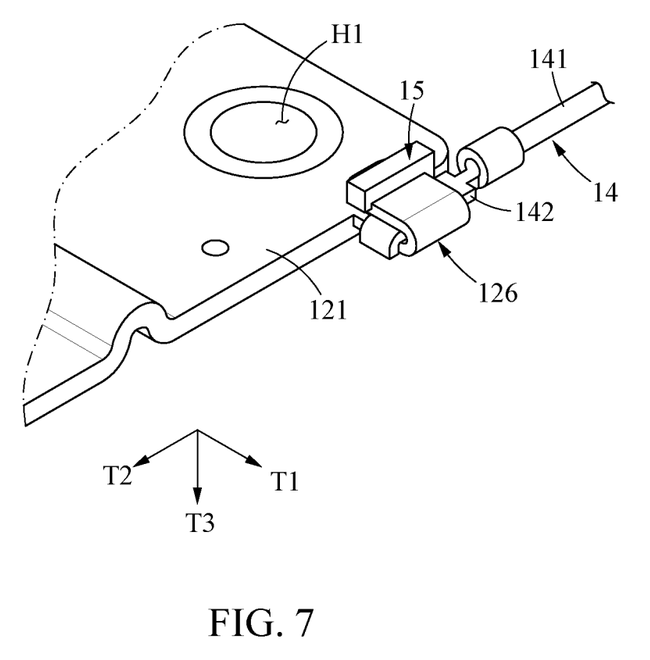
FIG. 7 is a diagram illustrating of an example of a first connector to which a temperature sensor is connected.

As shown in FIG. 7, the clamp 126 may be configured to clamp the temperature sensor 14. When the temperature sensor 14 is clamped to the clamp 126, the temperature sensor 14 may sense a temperature of the battery cell 11 through an electrode terminal to which the first connector 12A is connected.

Figure 8:
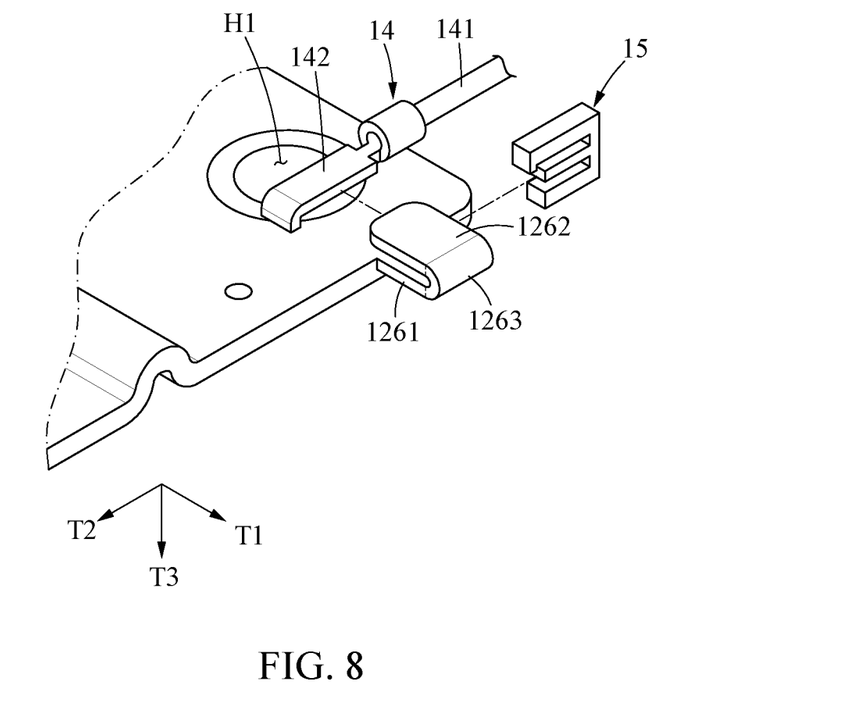
FIG. 8 is n diagram illustrating an example of a portion including a first connector, a temperature sensor, and a clip.

As shown in FIG. 8, the clamp 126 includes a first flat portion 1261, a second flat portion 1262, and a first curved portion 1263. The first flat portion 1261 may extend in a first direction T1 protruding from the edge of the base 121. The second flat portion 1262 may extend in the first direction T1 and be separate from the first flat portion 1261 in a normal line direction −T3 of the base 121. The first curved portion 1263 may connect the first flat portion 1261 and the second flat portion 1262. The first flat portion 1261, the second flat portion 1262, and the first curved portion 1263 may define an internal space in which the temperature sensor 14 is to be received.

In an example, the clamp 126 may be elastically deformable. For example, the second flat portion 1262 may be elastically deformed such that the temperature sensor 14 is engaged with the internal space of the clamp 126. Through such a structure, the temperature sensor 14 may be readily attachable to or detachable from the clamp 126. In general, when there is a failure in the circuit board 13 to which the temperature sensor 14 is permanently connected, the circuit board 13 and the temperature sensor 14 may be readily removable without a need to separate the first connector 12A.

The clamp 126 may be disposed adjacent to the terminal hole H1. Thus, a temperature of the battery cell 11 is sensed relatively more accurately, compared to applying a structure in which the clamp 126 is disposed remotely from the terminal hole H1.

Figure 10:
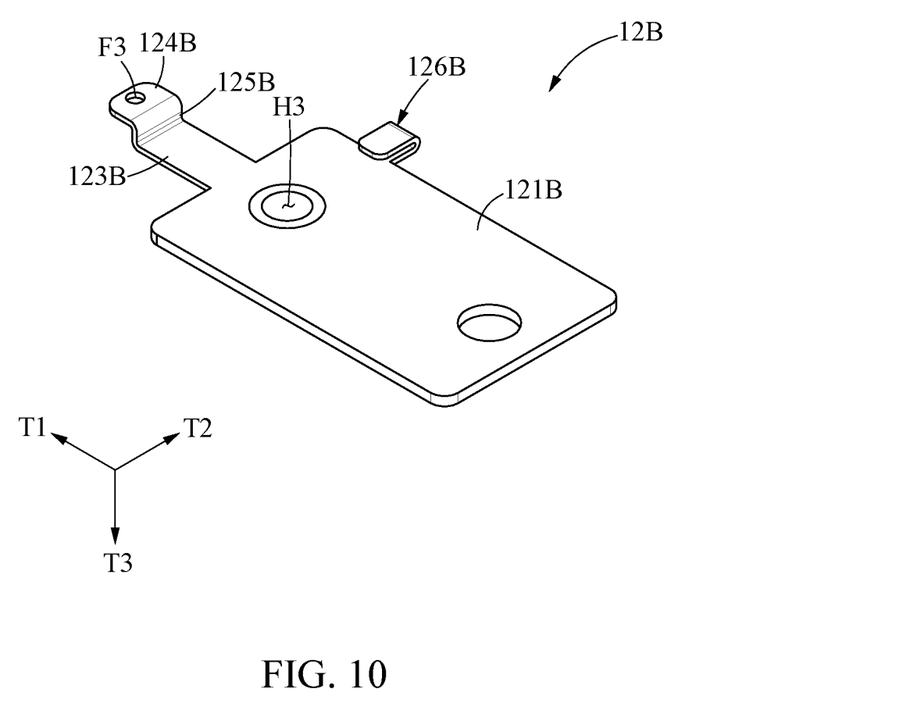
FIG. 10 is a diagram illustrating an example of a second connector.

As shown in FIG. 10, the second connector 12B includes a base 121B including a terminal hole H3, a protrusion 123B, a connecting portion 124B including a fastening hole F3, a stepped portion 125B, and a clamp 126B. The components of the second connector 12B described in the foregoing may correspond to the corresponding components of the first connector 12A in terms of function. In an example, the second connector 12B may differ from the first connector 12A in that the base 121B may further have a hole to be electrically connected to an external object. Thus, to compensate for a length for a connection to the support 16, the protrusion 123B of the second connector 12B may be longer than the protrusions 123 and 123' of the first connector 12A in protruding length.

The circuit boards may monitor battery characteristics of the battery cells. The battery characteristics used herein may include parameters, for example, a temperature and a voltage, of each of the battery cells. In an example, each of the circuit boards may be provided in a plate form. The circuit boards may be respectively provided to the battery cells.

In an example, the circuit board 13 may be provided above the first connector 12A and the second connector 12B. In an example, the circuit board 13 is not disposed between the first connector 12A and the battery cell 11, and is not disposed between the second connector 12B and the battery cell 11. Through such a disposition of a circuit board, when a failure occurs in one of the circuit boards, it is possible to readily separate the circuit board in which the failure occurs from a first connector and a second connector to which the circuit board is connected, without a need to replace all components of all the connectors and the battery cells of the battery system 1 with new components. Thus, it may be advantageous in terms of repair and maintenance for the battery system 1.

Figure 4:
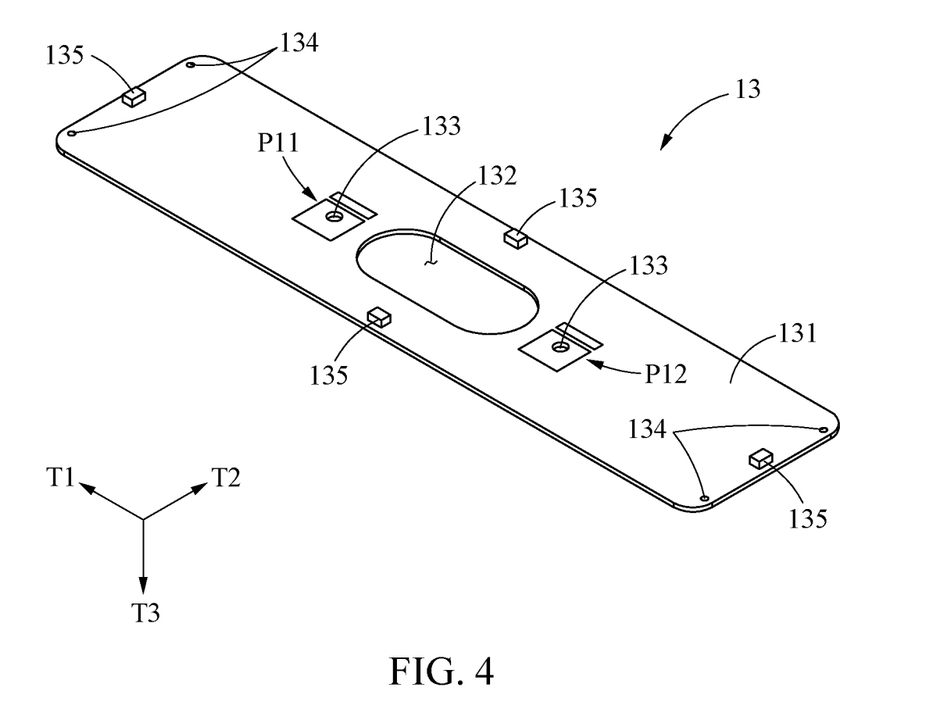
FIG. 4 is a diagram illustrating an example of a circuit board.
Figure 5:
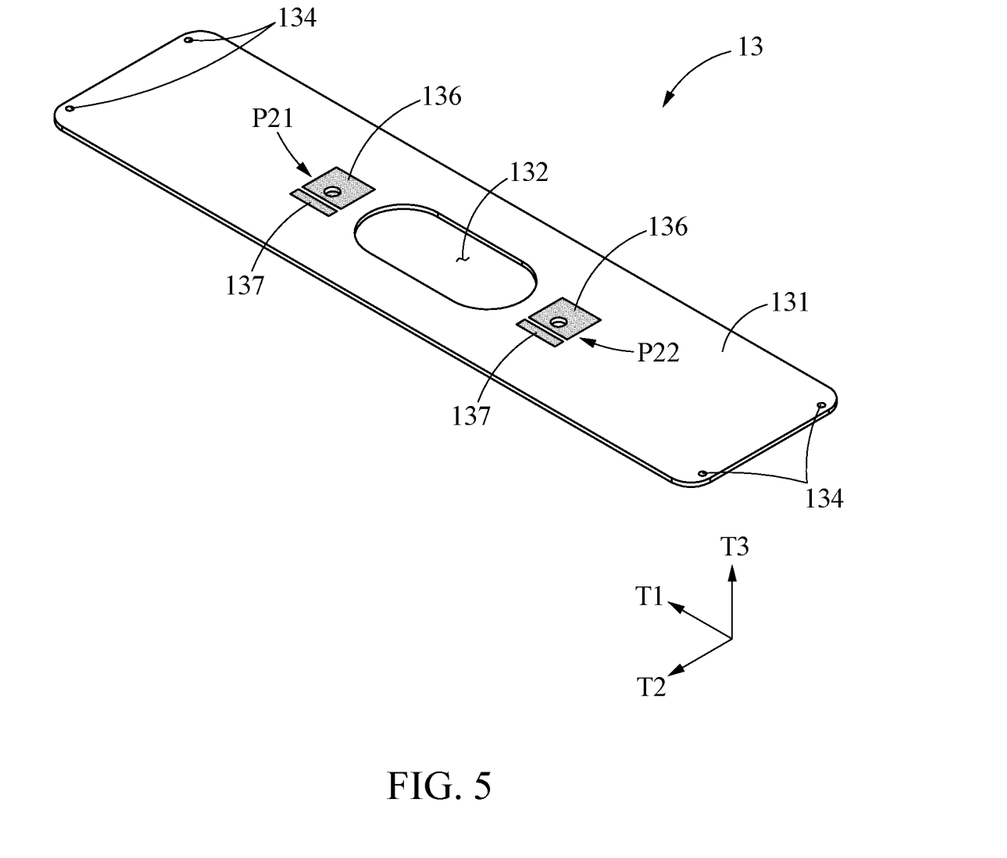
FIG. 5 is a diagram illustrating an example of a circuit board.

As shown in FIGS. 4 and 5, the circuit board 13 includes a plate 131, an opening 132, a pair of first fastening portions 133, a plurality of second fastening portions 134, a plurality of wireless communicators 135, a power receiver 136, and a voltage sensor 137.

In an example, the plate 131 is provided in a substantially rectangular shape. In an example, the opening 132 is formed at a center of the plate 131. The opening 132 may allow gas generated in the battery cell 11 (refer to FIG. 1) to pass. In an example, the opening 132 is provided in an elongated shape with a plurality of rounded corners.

A pair of first fastening portions 133 may be detachably attached to the first connector 12A and the second connector 12B. The pair of first fastening potions 133 may be respectively connected to the first connecting portion 124 and the second connecting portion 124' of the first connector 12A. For example, a fastening structure between the pair of first fastening portions 133, and the first connecting portion 124 and the second connecting portion 124' may be a bolt-nut connecting structure. When viewed from a length direction of the plate 131, the pair of first fastening portions 133 may be respectively formed on a first portion P11 and a second portion P12 which are on either sides of the opening 132. Thus, the pair of first fastening portions 133 may improve contact between the first connector 12A and the circuit board 13.

In an example, the second fastening portions 134 is detachably attachable to the support 16. In an example, the second fastening portions 134 may be formed on the plate 131 and may be located adjacent to a plurality of corners of the plate 131.

The wireless communicators 135 may wirelessly communicate with the battery cell 11 in which the circuit board 13 is provided and another circuit board provided on another battery cell. The wireless communicators 135 may, transmit and receive data associated with battery characteristics of the battery cells. The wireless communicators 135 may be provided on the plate 131 and may be located adjacent to the corners or the sides of the plate 131.

In an example, the power receiver 136 may receive power that is needed for an operation of the circuit board 13 through the first connector 12A or the second connector 12B, which are connected to the first electrode terminal 112 and the second electrode terminal 113 of the battery cell 11. The voltage sensor 137 may sense a voltage of the battery cell 11. In an example, the power receiver 136 and the voltage sensor 137 may be provided on a surface opposite to a surface of the plate 131 on which the wireless communicators 135 are provided. When viewed from the length direction of the plate 131, the power receiver 136 and the voltage sensor 137 may be respectively formed on a third portion P21 and a fourth portion P22 which are on either sides of the opening 132. A position of the third portion P21 and a position of the fourth portion P22 may be substantially the same as a position of the first portion P11 and a position of the second portion P12, respectively. Thus, through fastening only once, it is possible to sense a voltage of the circuit board 13 and to receive power.

The temperature sensor 14 may sense a temperature of the battery cell 11. As shown in FIG. 7, the temperature sensor 14 includes a flexible electrical wiring 141 and a contact portion 142 configured to be connected to the electrical wiring 141 and to the clamp 126. The contact portion 142 includes a horizontal portion extending from the electrical wiring 141 and a bent portion that is bent at an end of the horizontal portion.

Figure 9:
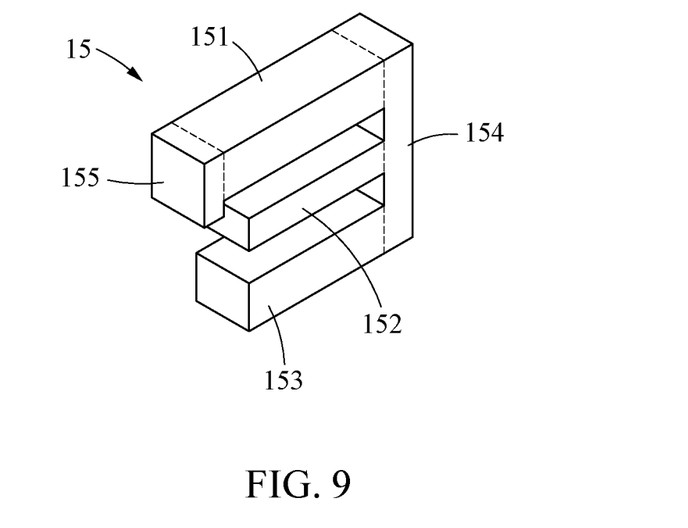
FIG. 9 is a diagram illustrating an example of a clip.

As shown in FIGS. 8-9, the clip 15 may fix the temperature sensor 14 to the clamp 126. Thus, when a disturbance, for example, an external impact and vibration, is applied to the battery system 1, such a structure may prevent the temperature sensor 14 from being separated from the clamp 126. That is, the clip 15 may securely mount the temperature sensor 14 to the clamp 126.

As shown in FIG. 9, the clip 15 includes a first extending portion 151, a second extending portion 152, a third extending portion 153, a fourth extending portion 154, and a fifth extending portion 155. In an example, the first extending portion 151, the second extending portion 152, and the third extending portion 153 may all extend in a substantially same direction. In an example, the first extending portion 151 may be longer than the second extending portion 152 and the third extending portion 153 in length. In an example, the fourth extending portion 154 may connect the first extending portion 151, the second extending portion 152, and the third extending portion 153. The fourth extending portion 154 may extend in a height direction that crosses an extending direction of the first extending portion 151, the second extending portion 152, and the third extending portion 153. In an example, the fifth extending portion 155 may extend from an end of the first extending portion 151 in the height direction that is the same as the extending direction of the fourth extending portion 154. A length of the fifth extending portion 155 from a lower portion of the first extending portion 151 that faces the second extending portion 152 may be less than a distance between the first extending portion 151 and the second extending portion 152. A structure formed by the first extending portion 151 and the second extending portion 152 may engage the clamp 126 to prevent the temperature sensor 14 from being dislodged. In addition, the third extending portion 153 may ensure a secure connection of the clip 15 to the clamp 126. In addition, the fifth extending portion 155 may prevent the clip 15 from being dislodged from the clamp 126 due to an external force that is applied to the clip 15.

The clip 15 may be elastically deformable. For example, the first extending portion 151 may bend with respect to the third extending portion 154 in a cantilever manner. When the first extending portion 151 is bend with respect to the third extending portion 154, and a force is applied to the clip 15 in a direction, for example, a −T2 direction, the clip 15 may be more readily removed from the clamp 126.

As shown in FIGS. 1 and 2, the support 16 may support the battery cells, the first connectors, the second connectors, and the circuit boards. The support 16 includes a plurality of first covers 161, a plurality of second covers 162, a frame 163, a first fixing portion 164, and a second fixing portion 165.

In an example, the first covers 161 and the second covers 162 is provided to surround the battery cells. In an example, the first covers 161 may cover relatively large area portions of the battery cells, and the second covers 162 may cover relatively small area portions of the battery cells. Here, a large area portion of a battery cell may refer to a portion that is relatively large in size among side surfaces that form a can of the battery cell, and a small area portion of the battery cell may refer to a portion that is relatively small in size among the side surfaces that form the can of the battery cell.

The frame 163 may be connected to the first covers 161 and the second covers 162, and extend along an upper edge of each of the first covers 162 and an upper edge of each of the second covers 162. Thus, the frame 163 may cover at least a portion of an upper side of the battery cells. In an example, a portion of the frame 163 may protrude toward a gap between one pair of neighboring battery cells.

The first fixing portion 164 and the second fixing portion 165 may fix the first connectors, the second connectors, and the circuit boards to prevent a movement thereof.

As shown in FIG. 2, the first fixing portion 164 includes a first rib 1641 and a second rib 1642. The first rib 1641 and the second rib 1642 may be connected to an upper edge of the first covers 161 that is disposed in front of each of the battery cells and a front side of the frame 163, and be connected to a rear side of the frame 163 by crossing an upper portion of each of the battery cells and an upper edge of the first covers 161 disposed on a rear side of the battery cells. In an example, the first rib 1641 and the second rib 1642 may be connected to the first connecting portion 124 and the second connecting portion 124' of the first connector 12A, the third connecting portion 124B of the second connector 12B, and the one pair of first fastening portions 133 of the circuit board 13.

The second fixing portion 165 includes a plurality of first holders 1651A and 1652A and a plurality of second holders 1651B and 1652B. The first holders 1651A and 1652A may extend above a first portion of the first connectors and above a first portion of the second connectors from an edge of the frame 163 being adjacent to each of corners of the frame 163. The second holders 1651B and 1652B may extend above a second portion of the first connectors and above a second portion of the second connectors from portions of the frame 163 that protrude between one pair of battery cells. The first holders 1651A and 1652A and the second holders 1651B and 1652B may be connected to a plurality of second fastening portions, for example, the second fastening portions 134, of the circuit boards.

The circuit boards may transmit and receive data through wireless communication through a plurality of wireless communicators, and thus a reliability of an arrangement of the circuit boards may need to be ensured. Using the first fixing portion 164 and the second fixing portion 165, it is possible to prevent the circuit boards from being erroneously arranged. For example, the first fixing portion 164 and the second fixing portion 165 may prevent a misarrangement of the circuit boards that may occur due to a vibration generated during transportation, such as, for example, in a vehicle.

Figure 11:
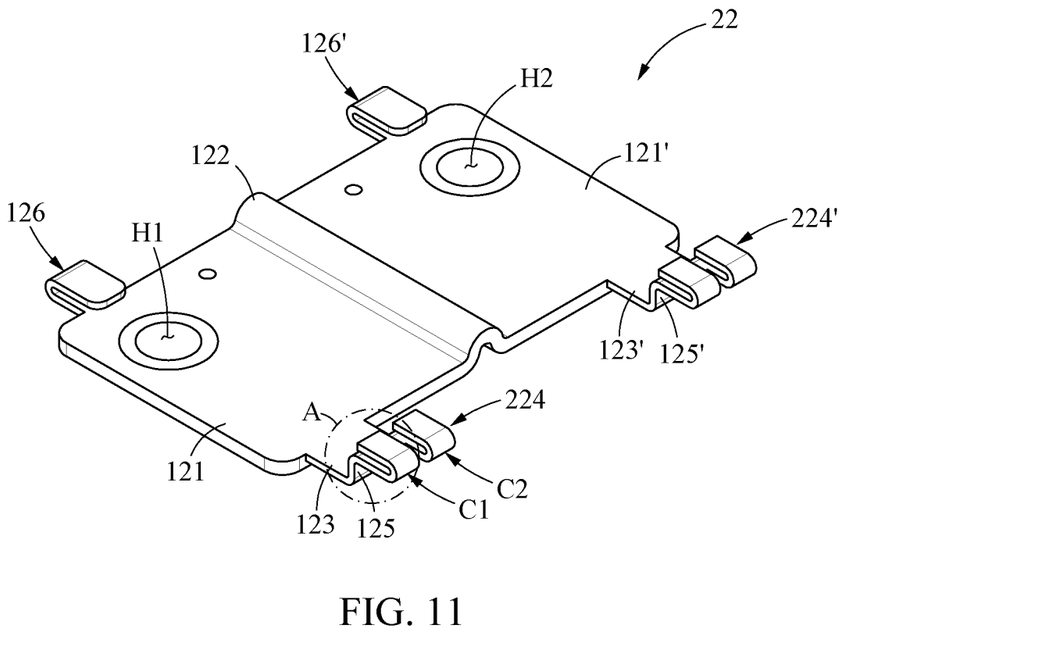
FIG. 11 is a diagram illustrating another example of a first connector.
Figure 12:
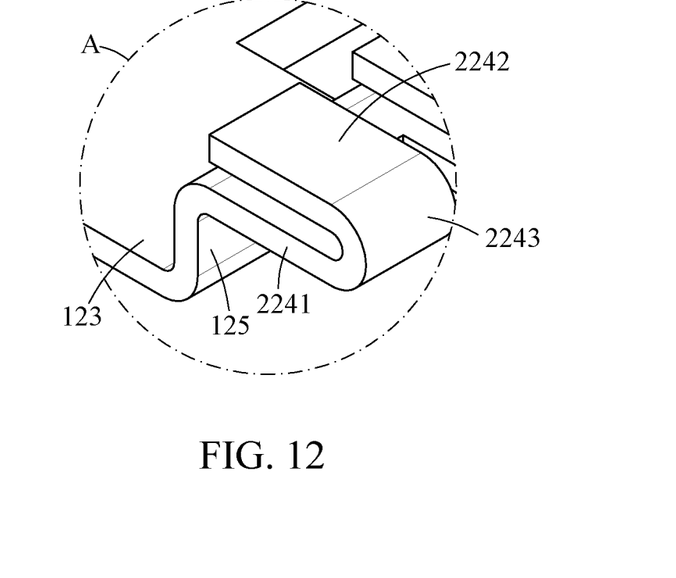
FIG. 12 is a diagram illustrating an example of an enlarged A portion of FIG. 11 including a second clamp.

Referring to FIGS. 11 and 12, according to another example, a connector 22 is different in terms of a structure of a connecting portion 224 from a structure of the connecting portions 124 and 124' of the first connector 12A described above with reference to FIGS. 1 through 10. The connecting portion 224 may have a similar structure as the illustrated structure of the first clamp 126.

The connecting portion 224 includes a second clamp C1 and a third clamp C2. The second clamp C1 and the third clamp C2 may elastically support the circuit board 13 (refer to FIG. 1). The second clamp C1 includes a third flat portion 2241, a fourth flat portion 2242, and a second curved portion 2243. The third clamp C2 also includes a third flat portion 2241, a fourth flat portion 2242, and a second curved portion 2243 that have the same structures and functions as the ones included in the second clamp C1.

The third flat portion 2241 may extend from the stepped portion 125 in a direction away from an edge of the base 121. A plane of the third flat portion 2241 may be vertical to a plane of the stepped portion 125. The plane of the third flat portion 2241 may be non-planar with the plane of the base 121, but be parallel to the plane of the base 121. The fourth flat portion 2242 may extend in a same direction as an extension direction of the third flat portion 2241. The fourth flat portion 2242 may be separated from the third flat portion 2241 in a normal direction of the base 121. In an example, the fourth flat portion 2242 may be elastically deformable. The second curved portion 2243 may connect the third flat portion 2241 and the fourth flat portion 2242 while being curved outwards, and may define an internal clearance between the third flat portion 2241 and the fourth flat portion 2242. Such a clearance and an elastically deformable characteristic of the second clamp C1 may improve a connection between the connector 22 and the circuit board 13.

The second clamp C1 and the third clamp C2 may support different portions of the circuit board 13. For example, the second clamp C1 may support the power receiver 136 of the circuit board 13 illustrated in FIG. 5, and the third clamp C2 may support the voltage sensor 137 of the circuit board 13 illustrated in FIG. 5. In addition, the second clamp C1 and the third clamp C2 may be separated from each other as illustrated. Through such a structure, it is possible to prevent interference between the second clamp C1 supporting the power receiver 136 and the third clamp C2 supporting the voltage sensor 137.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery system comprising:
 a first battery cell comprising a first electrode terminal and a second electrode terminal;
 a connector configured to be electrically connected to the first electrode terminal; and
 a first circuit board detachably mounted above the connector and configured to monitor a battery characteristic of the first battery cell,
 wherein the connector comprises:
  a base including a terminal hole configured to be connected to the first electrode terminal and having a first plane,
  a connecting portion configured to be connected to the first circuit board and having a second plane non-planar with the first plane, and the connecting portion comprising a first clamp configured to elastically support the first circuit board, and
  a stepped portion between the base and the connecting portion.

2. The battery system of claim 1, wherein the first plane and the second plane are parallel to each other.

3. The battery system of claim 1, wherein the connector further comprises:
 an elastically deformable clamp configured to be connected to a temperature sensor.

4. The battery system of claim 3, wherein the elastically deformable clamp is formed in the base and is disposed adjacent to the terminal hole.

5. The battery system of claim 3, wherein the elastically deformable clamp comprises:
 a first flat portion extending in a first direction from an edge of the base;
 a second flat portion extending in the first direction and being separate from the first flat portion; and
 a first curved portion connecting the first flat portion and the second flat portion, and defining a space that receives the temperature sensor.

6. The battery system of claim 3, further comprising:
 an elastically deformable clip configured to fix the temperature sensor to the elastically deformable clamp.

7. The battery system of claim 6, wherein the clip comprises:
 a first extending portion;
 a second extending portion extending in an extension direction that is same as an extension direction of the first extending portion; and
 a third extending portion connecting the first extending portion and the second extending portion and extending in an extension direction orthogonal to the extension direction of the first extending portion and the second extending portion.

8. The battery system of claim 7, wherein the clip further comprises:
 a fourth extending portion extending in an extension direction that is same as the extension direction of the first extending portion on an opposite side of the first extending portion with respect to the second extending portion, and being connected to the third extending portion.

9. The battery system of claim 7, wherein the clip further comprises:
 a fifth extending portion extending in an extension direction that is same as the extension direction of the third extending portion from an end portion of the first extending portion.

10. The battery system of claim 1, wherein the first circuit board comprises:
 a plate;
 a first portion of the plate to be attached to the connecting portion;
 a second portion of the plate on an opposite side of the first portion and extending in a direction away from the connection portion;
 a power receiver provided in the second portion and configured to receive power from the first battery cell through the connector; and
 a voltage sensor provided in the second portion and configured to sense a voltage of the first battery cell.

11. The battery system of claim 1, wherein the connecting portion is flat and configured to contact the first circuit board.

12. The battery system of claim 1, further comprising:
 a fixing portion disposed between the first battery cell and the connecting portion, and configured to be fastened to the connecting portion and the first circuit board to fix the connector and the first circuit board.

13. The battery system of claim 1, wherein the first clamp comprises:
 a third flat portion extending from the stepped portion;
 a fourth flat portion extending in a same extension direction as an extension direction of the third flat portion and being separate from the third flat portion; and
 a second curved portion connecting the third flat portion and the fourth flat portion.

14. The battery system of claim 1, wherein the first circuit board comprises:
 a power receiver configured to receive power from the first battery cell through the connector; and
 a voltage sensor configured to sense a voltage of the first battery cell,
 wherein the connecting portion comprises:
  the first clamp being configured to be connected to the power receiver; and
  a second clamp being separate from the first clamp and being configured to be connected to the voltage sensor and elastically support the first circuit board.

15. A battery system comprising:
 a first battery cell comprising a first electrode terminal and a second electrode terminal;
 a connector configured to be electrically connected to the first electrode terminal;
 a second battery cell comprising a third electrode terminal to which the connector is electrically connected, and a fourth electrode terminal to which the connector is not electrically connected;
 a first circuit board detachably mounted above the connector and configured to monitor a battery characteristic of the first battery cell; and
 a second circuit board detachably mounted above the connector and configured to monitor a battery characteristic of the second battery cell, wherein each of the first circuit board and the second circuit board comprise wireless communicators configured to wirelessly communicate with each other, and
wherein the connector comprises:
- a base including, a terminal hole configured e connected to the first electrode terminal and having a first plane,
- a connecting portion configured to be connected to the first circuit board and having a second plane non-planar with the first plane, and
- a stepped portion between the base and the connecting portion.

16. A battery system comprising:
a first battery cell comprising a first electrode terminal and a second electrode terminal;
a connector configured to be electrically connected to the first electrode terminal; and
a first circuit board detachably mounted above the connector,
wherein the connector comprises:
- a base having a first plane and comprising a hole configured to be connected to the first electrode terminal,
- a connecting portion non-planar with the first plane and configured to be connected to the first circuit board,
- a stepped portion between the base and the connecting portion, and
- a clamp comprising
  - a first flat portion extending away from an edge of the base,
  - a second flat portion separate from the first flat portion, and
  - a first curved portion connecting the first flat portion and the second flat portion to define a space to receive a temperature sensor.

17. The battery system of claim 16, wherein the second flat portion is elastically deformable to securely engage the temperature sensor.

18. The battery system of claim 16, wherein the clamp is formed in the base and is disposed adjacent to the terminal hole.

19. The battery system of claim 16, further comprising:
an elastically deformable clip configured to fix the temperature sensor to the clamp.

20. The battery system of claim 16, wherein the connecting portion is flat and configured to contact the first circuit board.

* * * * *